(12) United States Patent
Yamada

(10) Patent No.: US 6,458,207 B1
(45) Date of Patent: Oct. 1, 2002

(54) SILICON CARBIDE SINGLE-CRYSTALS

(75) Inventor: Yoshimitsu Yamada, Osaka (JP)

(73) Assignee: Nippon Pillar Packing Co, Ltd., Osaka (JP)

( * ) Notice: Subject to any disclaimer, the term of this patent is extended or adjusted under 35 U.S.C. 154(b) by 0 days.

(21) Appl. No.: 09/789,285

(22) Filed: Feb. 20, 2001

(30) Foreign Application Priority Data

Feb. 23, 2000 (JP) ........................................ 2000-045571

(51) Int. Cl.$^7$ .............................................. C30B 23/00
(52) U.S. Cl. ..................................... 117/105; 423/328.2
(58) Field of Search ......................... 117/105; 423/328.2

(56) References Cited

U.S. PATENT DOCUMENTS 5,709,745 A * 1/1998 Larkin et al. ................. 117/96

* cited by examiner

Primary Examiner—Felisa Hiteshew
(74) Attorney, Agent, or Firm—Baker & Daniels

(57) ABSTRACT

The present invention provides relates to silicon carbide single-crystals and in particular to silicon carbide single-crystals produced by supplying superfine silicon dioxide particles and superfine carbon particles to nucleating silicon carbide crystals and reducing the silicon dioxide by the carbon. The silicon carbide single-crystals according to the present invention comprise silicon carbide single-crystals grown on nucleating silicon carbide crystals, which are prepared by supplying and sticking superfine silicon dioxide particles and superfine carbon particles onto the surface of nucleating silicon carbide crystals kept in a heated state in an inert gas atmosphere and reducing the silicon dioxide by the carbon on the surface of the nucleating silicon carbide crystals thereby allowing silicon carbide single-crystals to grow on the nucleating silicon carbide crystals.

2 Claims, 1 Drawing Sheet

SILICON CARBIDE SINGLE-CRYSTALS

BACKGROUND OF THE INVENTION

1. Field of the Invention

The present invention relates to silicon carbide single-crystals and in particular to silicon carbide single-crystals produced by supplying superfine silicon dioxide particles and superfine carbon particles to nucleating silicon carbide crystals and reducing the silicon dioxide by the carbon.

2. Description of the Prior Art

Silicon carbide single-crystals are useful as materials for semiconductor devices such as environmental-resistant devices, power devices etc., and for producing them, various processes are used. Generally, the liquid phase of silicon carbide is not present at normal pressures and the crystallization thereof from the liquid phase is difficult by methods such as a drawing method for silicon single-crystals, and thus silicon carbide is produced conventionally by a process of sublimation i.e. crystallization from gaseous phases such as $Si_2C$, $SiC_2$ and Si. The process of sublimation includes an Acheson process for producing silicon carbide single-crystals by heating silicic anhydride and a carbon source at high temperatures and subsequent reaction thereof in a generated vapor or by a Larry [phonetic transcription] process or a modified Larry process of sublimation of silicon carbide powder in a graphite crucible to re-crystallize silicon carbide single-crystals in the graphite crucible. However, the Acheson process has the problem that the size of the resulting single crystals is low, their purity is low for use in semiconductor devices, while the Larry process and the modified Larry process have the problem that the reaction is complicated because silicon carbide gas does not possess a stoichiometric composition. Further, because its crystals grow while forming each layer from the gaseous phase by supplying atoms and molecules to the surface of nucleating crystals, growth of the single crystals in any of these processes is as significantly slow as about 1 mm/hour, as compared with a growth rate of about 100 mm/hour achieved by the drawing process for silicon single-crystals, and the yield in the prior art processes is also low. Further, the deficiency of hollows of several microns in diameter such as micro-pipes occurs easily, and β-type crystals are hardly obtained in the prior art processes.

As the method of crystallization from the gaseous phase, there is also a CVD method, but the resulting crystals are a thin film hardly usable as single crystals in substrates for devices etc.

SUMMARY OF THE INVENTION

The object of the present invention is to provide silicon carbide single-crystals of high-purity and large diameters obtainable at a higher rate of crystalline growth at lower costs with less generation of micro-pipes.

That is, the present invention relates to silicon carbide single-crystals comprising silicon carbide single-crystals grown on nucleating silicon carbide crystals, which are prepared by supplying and sticking superfine silicon dioxide particles and superfine carbon particles onto the surface of nucleating silicon carbide crystals kept in a heated state in an inert gas atmosphere and reducing the silicon dioxide by the carbon on the surface of the nucleating silicon carbide crystals thereby allowing silicon carbide single-crystals to grow on the nucleating silicon carbide crystals.

In the present invention, superfine silicon dioxide particles are heated at high temperatures, allowed to adhere to the surface of nucleating silicon carbide crystals, melted, fused into superfine carbon particles and reduced on the surface of said nucleating crystals, to form fine silicon carbide crystals, and by the phenomenon of melting and fluidization of the superfine particles, the formed fine silicon carbide crystals are fused into the surface of the nucleating crystals and formed into epitaxial crystals as single-crystals. The silicon carbide single-crystals of the present invention are obtained by directly supplying solid silicon dioxide and carbon to the surface of nucleating crystals and reacting them on the surface of the nucleating crystals, so that the rate of growth of single-crystals is rapid and micro-pipes occur hardly.

DETAILED DESCRIPTION OF THE INVENTION

Figure 1:
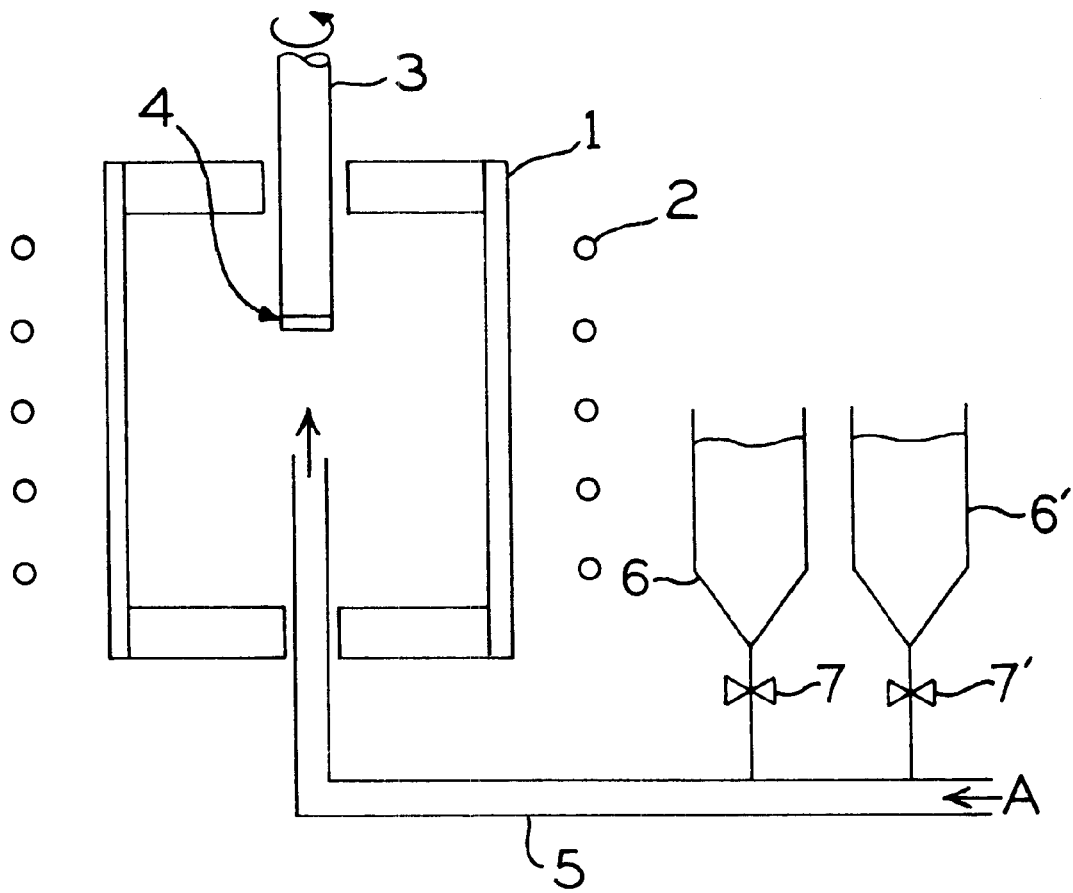
FIG. 1 is an illustration showing one example of an apparatus for producing the silicon carbide single-crystals of the present invention, wherein 1 is a heat-resistance vessel, 2 is a high-frequency induction heating coil, 3 is a nucleating silicon carbide crystal-keeping bar, 4 is nucleating silicon carbide crystals, 5 is a raw material-supplying pipe, 6 is a superfine silicon dioxide particle-storing tank, 6' is a superfine carbon particle-storing tank, 7, 7' are feed-regulating valves, and A is a carrier gas.

The type, particle diameter, particle shape etc. of the superfine silicon dioxide particles used in the present invention are not particularly limited, and for example, fumed silica can be mentioned.

The type, particle diameter, particle shape etc. of the superfine carbon particles used in the present invention are not particularly limited, and for example, carbon black such as channel black and farness black can be mentioned.

The ratio by weight of the superfine silicon dioxide particles to the superfine carbon particles to be supplied can be arbitrarily selected. The superfine silicon dioxide particles or the superfine carbon particles may be a mixture of two or more kinds of particles. As far as the effect of the present invention is not lowered, the superfine silicon dioxide particles and the superfine carbon particles may be subjected to pre-treatment or contain very small amounts of other components as necessary.

To supply the superfine silicon dioxide particles and the superfine carbon particles to the surface of the nucleating crystals, these superfine particles are preferably endowed with suitable speeds so that the superfine particles can adhere efficiently to the surface of the nucleating crystals. The method of supplying the superfine particles to the surface of the nucleating crystals is not particularly limited, and for example, the superfine particles are mixed with a carrier gas having a desired flow rate to be supplied to the surface of the nucleating crystals. The carrier gas used for this purpose includes an inert gas such as argon gas and nitrogen gas so that the atmosphere for growth of single-crystals is rendered inert. The superfine silicon dioxide particles and the superfine carbon particles may be supplied separately or in the form of their mixture insofar as they can be supplied in the form of their mixture to the surface of the nucleating crystals. If they are supplied in the form of their mixture, they may be mixed previously at the stage of raw materials or may be fed separately to the carrier gas.

Further, if e.g. silicon carbide single-crystals are to be doped, a component serving as a dopant may be mixed with the superfine particles or the carrier gas.

The constitution, size and shape of the nucleating silicon carbide crystals used in the present invention may be selected depending on the constitution, size and shape of the desired silicon carbide single-crystals, and for example, the nucleating silicon carbide crystals may be single crystals obtained by the Acheson process or the modified Larry [phonetic] process and treated as necessary.

The surface temperature of the nucleating silicon carbide crystals is preferably 1600 to 2300° C. but is not particularly limited insofar as the superfine silicon dioxide particles and superfine carbon particles having adhered thereto can be melted and react to form silicon carbide crystals, and by the phenomenon of melting fluidization, they are fused into the surface of the nucleating crystals.

The constitution (size, heating method, raw material-supplying method, atmosphere-regulating method etc.) of an apparatus used for producing the silicon carbide single-crystals of the present invention is not particularly limited, and can be selected depending on the size and shape of the desired silicon carbide single-crystals as well as on the type of the raw materials.

The conditions for production of the silicon carbide single-crystals are not particularly limited either, and can be selected depending on the size and shape of the desired silicon carbide single-crystals, the type of the raw materials, the type of the carrier gas, etc.

EXAMPLES

Example 1

As one example of the apparatus for producing the silicon carbide single-crystals of the present invention, the apparatus shown in FIG. 1 was used to produce the silicon carbide single-crystals. The apparatus in FIG. 1 includes a carbon-sealed crucible of 50 m in diameter and 100 mm in height as heat-resistant crucible 1 installed in a high-frequency induction heating coil 2 in an induction heating furnace, wherein a nucleating silicon carbide crystal-keeping bar 3 for keeping the nucleating silicon carbide crystals is inserted through the top of the carbon-sealed crucible, while a penetration hole of 10 mm in diameter is arranged in the bottom thereof, through which a raw material-supplying pipe 5 (carbon pipe of 8 mm in outer diameter) is penetrated for supplying the starting materials i.e. the superfine particles to the carbon-sealed crucible. The nucleating silicon carbide crystal-keeping bar 3 is rotatable with a central shaft of the nucleating silicon carbide crystal-keeping bar 3 as a rotating shaft by a driving mechanism not shown, and a radiation thermometer not shown is arranged on the top of the carbon-sealed crucible, to measure the temperature of the top of the crucible, and depending on this temperature, the output power of the high-frequency induction heating coil 2 is controlled in order to regulate the temperature in the crucible.

The pressure in the induction-heating furnace can be regulated by a vacuum pump and a pressure-regulating valve not shown, so that the pressure of the reaction atmosphere in the carbon-sealed crucible can be regulated. The raw material-supplying tube 5 is connected to the superfine silicon dioxide particle-storing tank 6, to the superfine carbon particle-storing tank 6' outside of the induction heating furnace, and to a carrier gas-supplying source (not shown) capable of regulating the flow rate, by which the superfine silicon dioxide particles and superfine carbon particles, along with the carrier gas A, can be supplied to the inside of the carbon-sealed crucible. The superfine silicon dioxide particles and superfine carbon particles are endowed with suitable speeds by supplying them together with the carrier gas, and transferred to the surface of the nucleating silicon carbide crystals fixed in the inside of the crucible, to permit these particles to adhere to the surface of the nucleating silicon carbide crystals. The amount of the superfine silicon dioxide particles and superfine carbon particles supplied is regulated by the feed-regulating valves 7, 7'.

Production of silicon carbide single-crystals (growth of single crystals) is conducted as follows. The nucleating silicon carbide crystal-keeping bar 3 is kept in an upper part of the carbon-sealed crucible (heat-resistant crucible 1), the nucleating silicon carbide crystal 4 with the constitution shown below is fixed on the bar 3, the carbon-sealed crucible is arranged in an induction heating furnace, the induction heating furnace is evacuated and the gas therein is replaced by an argon gas. Then, the carbon-sealed crucible is heated by a high-frequency induction heating coil 2, and the surface of the nucleating silicon carbide crystals is heated at 1600 to 2300° C.

Along with the carrier gas (argon gas), the following raw materials used as the superfine silicon dioxide particles and superfine carbon particles were supplied to the crucible under the following conditions. Along with the silicon dioxide particles and superfine carbon particles, a certain amount of silicon powder for preventing carbonization was simultaneously added by a feeding device not shown in the drawing. While the superfine particles were supplied, the nucleating crystals were rotated on a horizontal plane by the nucleating silicon carbide crystal-storing bar 3. As a result, growth of the nucleating silicon carbide crystals having a thickness of more than 250 $\mu$m was observed on the surface of the nucleating silicon carbide crystals.

[Raw materials]
Superfine silicon dioxide ($SiO_2$) particles:
  AEROSIL-380 (Nippon Aerosil Co., Ltd.) (average diameter of primary particles=7 nm, BET specific surface area=380 $m^2/g$)
Superfine carbon (C) particles:
  Carbon Black MA600 (Mitsubishi Kagaku Co., Ltd.) (average diameter of primary particles=18 nm, specific surface area by a nitrogen absorption method=140 $m^2/g$).
Silicon (Si) powder
  (Pure at the electron level, average diameter=1 $\mu$m) The fine silicon dioxide particles and fine carbon particles described above had been dried in the air at 200° C. for 3 hours in an electric oven.

[Conditions for Production of Single Crystals]
Surface temperature of the nucleating silicon carbide crystals: 1600 to 2300° C.
Carrier gas: argon gas at a flow rate of 10 L/min.
Atmosphere in the carbon-sealed crucible: argon gas (25 kPa or less).
Ratio of the superfine silicon dioxide particles to the superfine carbon particles compounded: $SiO_2/C$=1.5 to 5.0 (ratio by weight).
Feed of the superfine silicon dioxide particles and superfine carbon particles: 1 to 3 g/min.
Time of supplying the superfine silicon dioxide particles and superfine carbon particles: 10 minutes.
Constitution of the nucleating silicon carbide crystals: Face C of silicon carbide single-crystals formed by the Acheson process is polished at an inclined angle of 5° to the direction of crystallographic axis below:

<11$\bar{2}$0>

The silicon carbide single-crystals of the present invention have high-purity and large diameters and are advantageous in respect of costs because of high rates of crystalline growth with less generation of micro-pipes. Further, β-type crystals, which are hardly obtainable in the conventional processes, can be obtained in the present invention.

What is claimed is:

1. Silicon carbide single-crystals comprising silicon carbide single-crystals grown on nucleating silicon carbide crystals, which are prepared by supplying and sticking superfine silicon dioxide particles and superfine carbon particles onto a surface of nucleating silicon carbide crystals kept in a heated state in an inert gas atmosphere and reducing the silicon dioxide by the carbon on the surface of the nucleating silicon carbide crystals thereby allowing silicon carbide single-crystals to grow on the nucleating silicon carbide crystals.

2. The silicon carbide single-crystals according to claim 1, wherein the surface temperature of the nucleating silicon carbide crystals is 1600 to 2300° C.

* * * * *